US011322378B2

(12) United States Patent
Kawai et al.

(10) Patent No.: US 11,322,378 B2
(45) Date of Patent: May 3, 2022

(54) EQUIPMENT FRONT END MODULE

(71) Applicant: Sinfonia Technology Co., Ltd., Tokyo (JP)

(72) Inventors: Toshihiro Kawai, Tokyo (JP); Gengoro Ogura, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 16/980,528

(22) PCT Filed: Mar. 13, 2019

(86) PCT No.: PCT/JP2019/010352
§ 371 (c)(1),
(2) Date: Sep. 14, 2020

(87) PCT Pub. No.: WO2019/177048
PCT Pub. Date: Sep. 19, 2019

(65) Prior Publication Data
US 2021/0013077 A1 Jan. 14, 2021

(30) Foreign Application Priority Data

Mar. 15, 2018 (JP) .............................. JP2018-048432

(51) Int. Cl.
*H01L 21/673* (2006.01)
*H01L 21/677* (2006.01)

(52) U.S. Cl.
CPC .. *H01L 21/67393* (2013.01); *H01L 21/67766* (2013.01)

(58) Field of Classification Search
CPC ......... H01L 21/67393; H01L 21/67389; H01L 21/67196; H01L 21/67775; H01L 21/67766
See application file for complete search history.

(56) References Cited

U.S. PATENT DOCUMENTS 4,923,352 A * 5/1990 Tamura .................. B25J 21/005
29/722
5,326,316 A * 7/1994 Hashimoto ....... H01L 21/67017
454/187

(Continued)

FOREIGN PATENT DOCUMENTS

JP 2002359180 A 12/2002
JP 2013089689 A 5/2013

(Continued)

OTHER PUBLICATIONS

Japan Patent Application No. PCT/JP2019/010352, International Search Report (and translation) and Written Opinion, dated May 21, 2019.

*Primary Examiner* — Glenn F Myers
(74) *Attorney, Agent, or Firm* — Kilpatrick Townsend & Stockton LLP

(57) ABSTRACT

In an inert-gas circulating type EFEM, generation of any constraints on installation of incidental equipment, a maintenance door, or the like is inhibited, and the need for changing the placement position, etc. of a feedback path according to the specifications, etc. of a substrate processing device connected thereto is eliminated. An EFEM 1 is provided with: a transfer chamber 41 in which a wafer W is conveyed; a unit installation chamber 42 in which a FFU 44 for feeding nitrogen to the transfer chamber 41 is installed; and a return path 43 for feeding the nitrogen having flown through the transfer chamber 41, back to the unit installation chamber 42. A substrate processing apparatus 6 is connected to the rear-side end of the transfer chamber 41. The return path 43 is disposed at the front-side end of the transfer chamber 41.

13 Claims, 6 Drawing Sheets

(56) References Cited

U.S. PATENT DOCUMENTS

| | | | |
|---|---|---|---|
| 9,272,315 B2* | 3/2016 | Chou | B01D 46/446 |
| 9,704,727 B2* | 7/2017 | Segawa | H01L 21/67772 |
| 2015/0170945 A1 | 6/2015 | Segawa et al. | |
| 2016/0260627 A1* | 9/2016 | Nakano | H01L 21/67772 |
| 2017/0170044 A1* | 6/2017 | Okabe | H01L 21/67775 |
| 2018/0040493 A1 | 2/2018 | Kawai et al. | |
| 2018/0323086 A1 | 11/2018 | Shigeta et al. | |

FOREIGN PATENT DOCUMENTS

| | | | |
|---|---|---|---|
| JP | 2014027258 A | 2/2014 | |
| JP | 2015146349 A | 8/2015 | |
| JP | 2016162818 A | 9/2016 | |
| JP | 2017092233 A | 5/2017 | |

* cited by examiner

Time-dependent change of pressure in FFU installation chamber

Time-dependent change of rotation speed of fan

EQUIPMENT FRONT END MODULE

CROSS-REFERENCE TO RELATED APPLICATIONS

This application is a national phase entry under 35 USC § 371 of International Application PCT/JP2019/010352 ("the '352 application"), filed Mar. 13, 2019, which application claims priority to and benefits of Japan Patent Application No. 2018-048432 ("the '432 application"), filed on Mar. 15, 2018. The '352 application and the '432 applications are hereby incorporated in their entireties by this reference.

TECHNICAL FIELD

The present disclosure relates to an EFEM (Equipment Front End Module) capable of circulating an inert gas.

BACKGROUND

Patent Documents 1 and 2 disclose EFEMs that deliver a wafer between a substrate processing apparatus for performing a predetermined process on a wafer and a container for storing the wafer. Each of the EFEMs includes a transfer robot that holds and transfers a wafer, and a transfer chamber in which the transfer robot is arranged.

Conventionally, the influence of oxygen, moisture and the like in a transfer chamber on a semiconductor circuit manufactured on a wafer was small. However, in recent years, such influence has become apparent as a semiconductor circuit is further miniaturized. Thus, each of the EFEMs described in Patent Documents 1 and 2 includes a circulation path including a transfer chamber and configured so that nitrogen circulates therethrough, a supply unit configured to supply nitrogen into the circulation path, and a discharge unit configured to discharge the gas in the circulation path. Thus, by adjusting the nitrogen supply flow rate and the gas discharge flow rate as needed while circulating the nitrogen, it is possible to keep the circulation path in a nitrogen atmosphere while suppressing an increase in the nitrogen supply flow rate.

More specifically, the circulation path includes the above-mentioned transfer chamber, a chamber (unit installation chamber) in which a fan filter unit for sending nitrogen to the transfer chamber is installed, and a return path for returning nitrogen in the transfer chamber to the unit installation chamber. The return path described in Patent Document 1 is arranged on one side surface of the transfer chamber. The return path described in Patent Document 2 is formed by using a back wall of the transfer chamber. The back wall is connected to a substrate processing apparatus.

Furthermore, in general, an incidental facility is often installed in the transfer chamber. As an example of the incidental facility, as shown in FIG. 6 of Patent Document 1, there may be provided an aligner or the like for correcting a wafer holding position at which a wafer is held by a transfer robot.

PRIOR ART DOCUMENTS

Patent Documents

Patent Document 1: Japanese laid-open publication No. 2014-27258

Patent Document 2: Japanese laid-open publication No. 2015-146349

In general, the incidental facility such as the aligner or the like described above, a maintenance door and the like are often installed on the side surface of the transfer chamber. Therefore, when the return path is arranged on one side surface of the transfer chamber (i.e., when the one side surface of the transfer chamber is occupied by the return path) as described in Patent Document 1, as compared with a case where the return path is not arranged on the side surface, restrictions may be imposed on the installation of the incidental facility, the maintenance door and the like. Furthermore, in the EFEM described in Patent Document 2, the return path is formed by using the back wall. Since the back wall is connected to the substrate processing apparatus, it may be necessary to change the arrangement position of the return path and the like according to the specifications of the substrate processing apparatus. Therefore, there is a problem that mass production becomes difficult.

The present disclosure provides some embodiments of an inert gas circulation type EFEM capable of suppressing imposition of restrictions on the installation of an incidental facility, a maintenance door and the like, and making it unnecessary to change an arrangement position of a return path and the like according to the specifications of a substrate processing apparatus connected to the return path.

SUMMARY

According to a first aspect of the present disclosure, an EFEM includes: a transfer chamber in which a substrate is transferred; a unit installation chamber in which a fan filter unit configured to send an inert gas to the transfer chamber is installed; and a return path configured to return the inert gas flowing in the transfer chamber to the unit installation chamber, wherein a substrate processing apparatus configured to perform a predetermined process on the substrate is connected to one end portion of the transfer chamber at one side of a predetermined depth direction, and the return path is arranged in an other end portion of the transfer chamber at an other side of the depth direction.

According to this aspect, the return path is arranged in the end portion of the transfer chamber in the depth direction. Thus, it is possible to adopt a configuration in which neither of both end portions (side surfaces) in the direction orthogonal to the depth direction is occupied by the return path. Therefore, it is possible to suppress imposition of restrictions on the installation of an incidental facility, a maintenance door or the like. In addition, by adopting the configuration in which the return path is not arranged in the one end portion at the one side of the depth direction, it is possible to eliminate the need to change the arrangement position of the return path according to the specifications of the substrate processing apparatus. Therefore, in the inert gas circulation type EFEM, it is possible to suppress imposition of restrictions on the installation of an incidental facility, a maintenance door or the like, and to make it unnecessary to change the arrangement position of the return path according to the specifications of the substrate processing apparatus connected to the return path.

According to a second aspect of the present disclosure, the EFEM of the first aspect may further include: a columnar member arranged in the other end portion of the transfer chamber at the other side of the depth direction and forming the transfer chamber, wherein the columnar member may be hollow, and the return path may be installed inside the columnar member.

According to this aspect, the return path is built in the hollow columnar member. Therefore, it is possible to suppress an increase in the installation area of the EFEM as compared with a configuration in which the return path is installed separately from the columnar member.

According to a third aspect of the present disclosure, the EFEM of the second aspect may further include: an introduction duct installed in the columnar member so as to communicate with the return path and configured to guide the inert gas in the transfer chamber to the return path; and a fan installed in the introduction duct and configured to send the inert gas in the return path toward the unit installation chamber.

With the configuration in which the return path is installed inside the columnar member, it may be difficult to secure a large flow path area for the return path. Therefore, it is preferable to actively send the inert gas toward the unit installation chamber by the fan. However, if the fan is to be installed inside the columnar member, it may be difficult to install the fan from the viewpoint of workability and size of the fan. According to this aspect, the fan can be easily installed by appropriately adjusting the size of the introduction duct and the like.

According to a fourth aspect of the present disclosure, the EFEM of the third aspect, the circulation path may be configured so that the inert gas in the transfer chamber flows downward, an opening portion through which the inert gas flows may be formed in the introduction duct, and the opening portion may be configured to face downward.

According to this aspect, the gas reaching the partition wall 31 from above can be smoothly sucked inward without disturbing the flow of the gas flowing from above. Further, the gas sucked through the opening 29a can be allowed to flow upward without changing the gas flow direction.

According to a fifth aspect of the present disclosure, the EFEM of any one of the second to fourth aspects may further include: a plurality of the columnar members, as the columnar member, arranged side by side in a width direction orthogonal to the depth direction; and a plurality of load ports arranged on the other side of the depth direction than the transfer chamber, arranged side by side in the width direction, and each configured to mount a container accommodating the substrate, wherein a plurality of openings for loading and unloading the substrate into and from the container mounted on each of the load ports may be formed in the other end portion of the transfer chamber at the other side of the depth direction, the plurality of openings may be respectively arranged between the plurality of columnar members in the width direction, and the return path may be installed inside each of the plurality of columnar members.

According to this aspect, the plurality of columnar members and the plurality of openings are arranged at positions where they do not overlap each other in the width direction (i.e., so that the columnar members do not interfere with the substrate when the substrate is carried into and out of the container). Furthermore, the return path is installed inside each of the columnar members. Since a plurality of return paths is installed by efficiently utilizing the space in which the columnar members can be arranged, it is possible to easily secure the required flow path area while suppressing the increase in the size of each of the columnar members.

According to a sixth aspect of the present disclosure, the EFEM of any one of the first to fifth aspects may further include: a gas supplier configured to supply the inert gas to at least one of the transfer chamber, the unit installation chamber and the return path; a discharger configured to discharge a gas containing the inert gas from at least one of the transfer chamber, the unit installation chamber and the return path; a first pressure detector installed in the transfer chamber; and a controller, wherein the controller may be configured to adjust a gas discharge amount discharged from the discharger according to a supply amount of the inert gas or a detection result of the first pressure detector of the transfer chamber.

In the inert gas circulation type EFEM, it is necessary to quickly reduce the concentration of impurities when the concentration of a gas (i.e., impurities) other than the inert gas increases. According to this aspect, the concentration of impurities can be promptly reduced by supplying the inert gas to the circulation path. Furthermore, by discharging the gas according to the supply amount of the inert gas or the pressure change in the transfer chamber, it is possible to appropriately control the pressure in the transfer chamber.

According to a seventh aspect of the present disclosure, the EFEM of any one of the first to sixth aspects may further include: a fan configured to send the inert gas in the return path toward the unit installation chamber; a driver configured to rotationally drive the fan; a second pressure detector arranged in the unit installation chamber; and a controller, wherein the controller may be configured to control the driver based on a detection result of the second pressure detector so that a pressure in the unit installation chamber is maintained at a target pressure.

According to this aspect, the inert gas in the return path is actively returned to the unit installation chamber by the fan. However, if the rotation speed of the fan is slow and the flow rate of the inert gas returning to the unit installation chamber is too low, the pressure in the unit installation chamber may decrease, and external gas may easily enter the unit installation chamber. Conversely, if the rotation speed of the fan is high and the flow rate of the inert gas returning to the unit installation chamber is too high, the pressure in the unit installation chamber may rise and the flow of the inert gas sent to the transfer chamber by the fan filter unit may easily become unstable. According to this aspect, the controller controls the driver (that is, controls the rotation speed of the fan) to maintain the pressure in the unit installation chamber at an appropriate target pressure, thereby suppressing the occurrence of the above problem.

DETAILED DESCRIPTION

Figure 1:
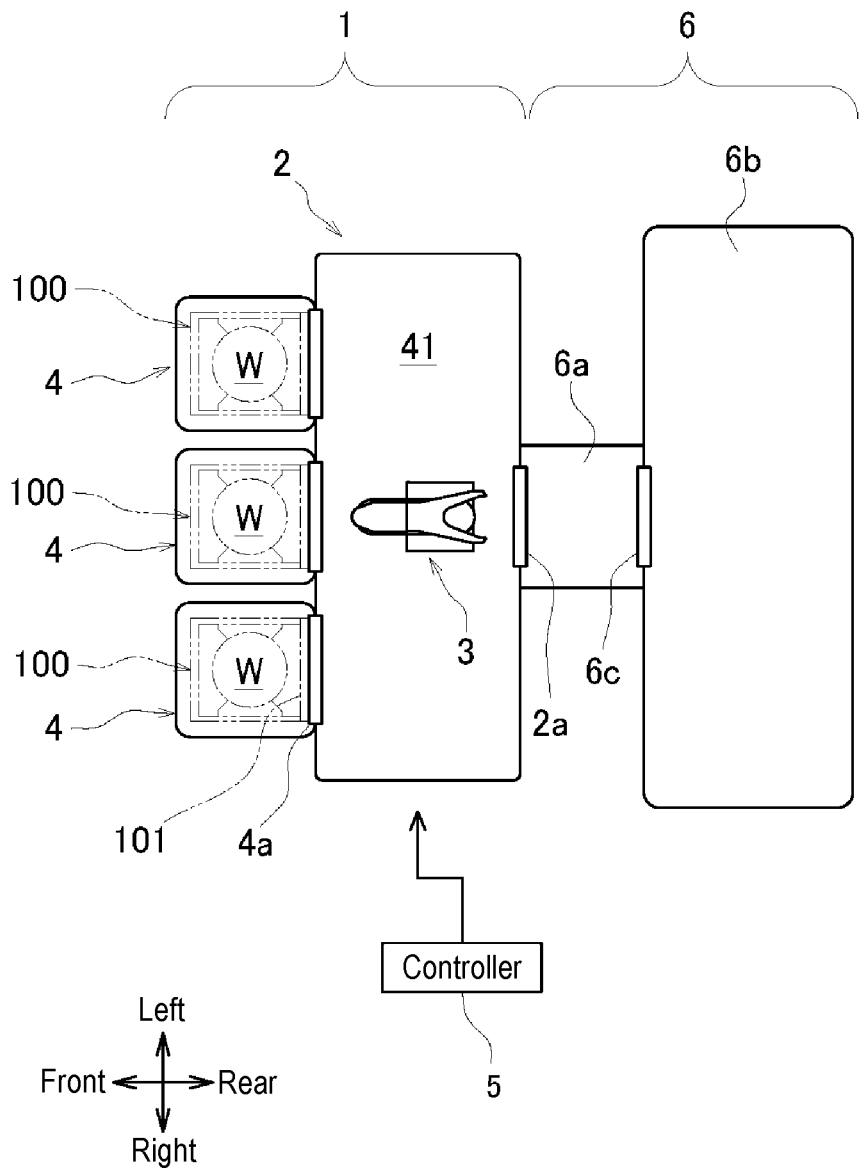
FIG. 1 is a schematic plan view of an EFEM according to the present embodiment and the surroundings thereof.

Next, an embodiment of the present disclosure will be described with reference to FIGS. 1 to 6B. For the convenience of explanation, the directions shown in FIG. 1 are defined as front, rear, left and right directions. That is, the direction in which an EFEM (Equipment Front End Module) 1 and a substrate processing apparatus 6 are arranged side by side is defined as a front-rear direction (a depth direction in the present disclosure). The side of the EFEM 1 is defined as a front side (the other side in the present disclosure), and the side of the substrate processing apparatus 6 is defined as a rear side (one side in the present disclosure). The direction in which a plurality of load ports 4 is arranged side by side and which is orthogonal to the front-rear direction, is defined as a left-right direction (a width direction in the present disclosure). In addition, the direction orthogonal to both the front-rear direction and the left-right orthogonal is defined as an up-down direction.

(Schematic Configuration of EFEM and Surroundings Thereof)

Figure 2:
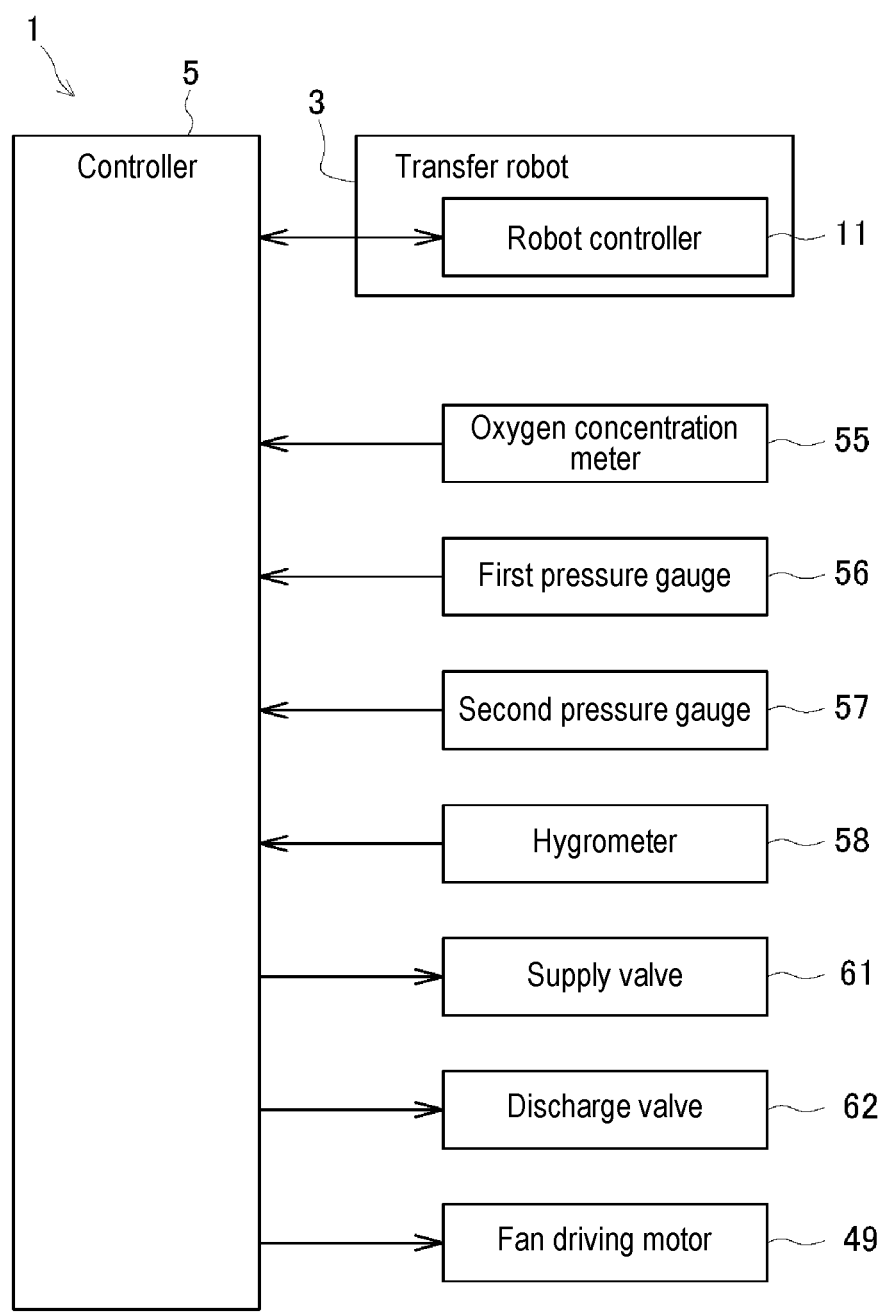
FIG. 2 is a diagram showing an electrical configuration of the EFEM.

First, the schematic configuration of the EFEM 1 and surroundings thereof will be described with reference to FIGS. 1 and 2. FIG. 1 is a schematic plan view of the EFEM 1 according to the present embodiment and the surroundings thereof. FIG. 2 is a diagram showing the electrical configuration of the EFEM 1. As shown in FIG. 1, the EFEM 1 includes a housing 2, a transfer robot 3, a plurality of load ports 4, and a control device 5 (a controller in the present disclosure). A substrate processing apparatus 6 that performs a predetermined process on a wafer W (a substrate in the present disclosure) is arranged in the rear of the EFEM 1. The EFEM 1 delivers the wafer W between an FOUP (Front-Opening Unified Pod) 100 mounted on the load port 4 and the substrate processing apparatus 6 using the transfer robot 3 arranged in the housing 2. The FOUP 100 is a container capable of accommodating a plurality of wafers W side by side in the up-down direction, and has a lid 101 attached to the rear end portion thereof (the end portion on the side of the housing 2 in the front-rear direction). The FOUP 100 is transferred by, for example, an OHT (overhead traveling automatic transfer vehicle) (not shown) that travels in a state in which it is suspended by a rail (not shown) installed above the load port 4. The FOUP 100 is delivered between the OHT and the load port 4.

The housing 2 is used to connect the plurality of load ports 4 and the substrate processing apparatus 6. Inside the housing 2, there is formed a transfer chamber 41 which is substantially sealed from the external space and in which the wafer W is transferred. When the EFEM 1 is operating, the transfer chamber 41 is filled with nitrogen (an inert gas in the present disclosure). The housing 2 is configured so that nitrogen circulates through the internal space including the transfer chamber 41 (details of which will be described later). A plurality of load ports 4 is arranged on the front side of the transfer chamber 41. Furthermore, a door 2a is attached to the rear end of the housing 2. The transfer chamber 41 is connected to the substrate processing apparatus 6 with the door 2a interposed therebetween.

The transfer robot 3 is arranged in the transfer chamber 41 and configured to transfer the wafer W. The transfer robot 3 includes a base part 3a (see FIG. 3) whose position is fixed, an arm mechanism 3b (see FIG. 3) arranged above the base part 3a to hold and transfer the wafer W, and a robot controller 11 (see FIG. 2). The transfer robot 3 mainly performs an operation of taking out the wafer W from the FOUP 100 and delivering it to the substrate processing apparatus 6, and an operation of receiving the wafer W processed by the substrate processing apparatus 6 and returning it to the FOUP 100.

Figure 5:
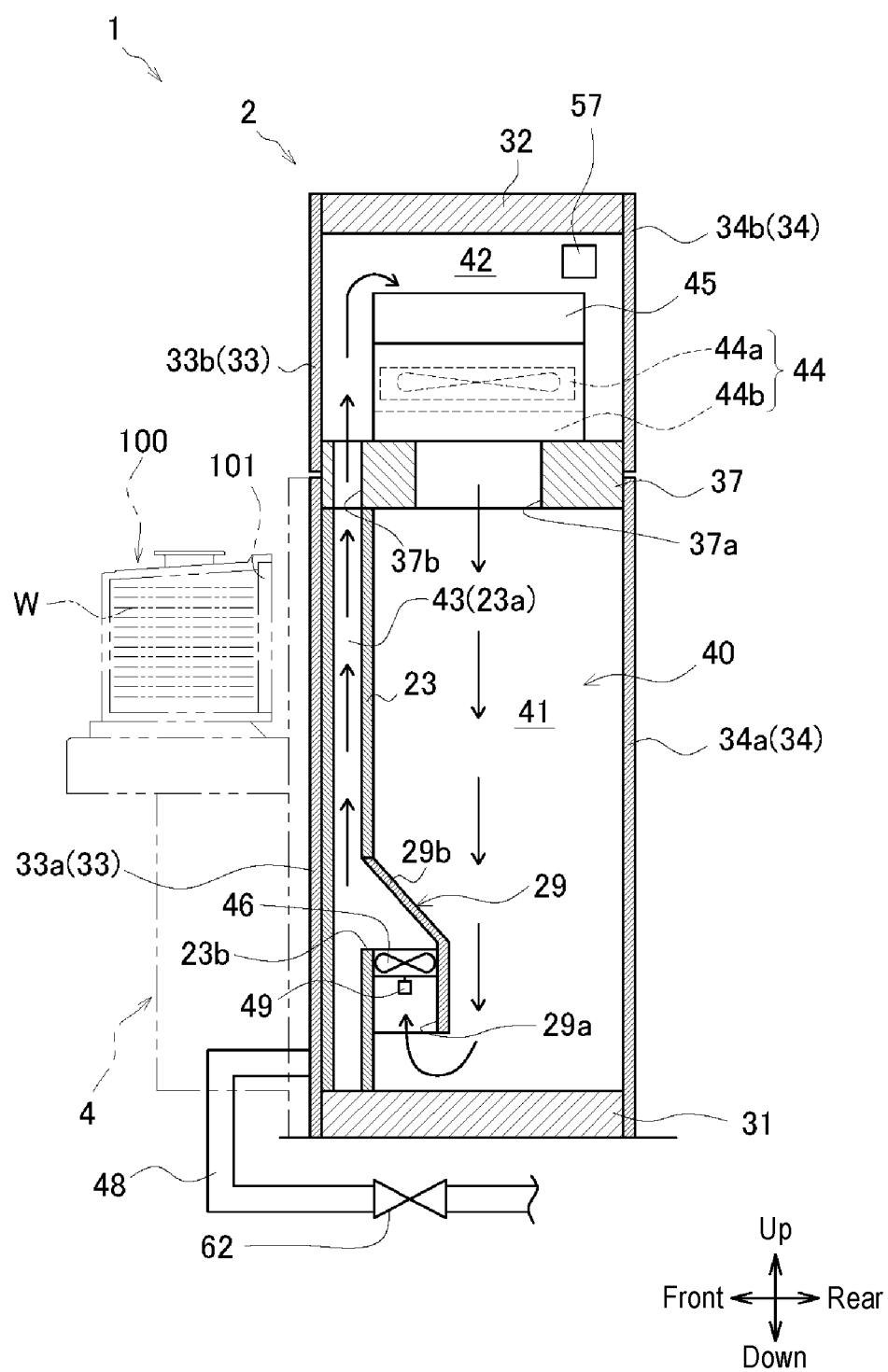
FIG. 5 is a sectional view taken along line V-V in FIG. 3.

The load port 4 is configured to mount the FOUP 100 (see FIG. 5). The plurality of load ports 4 is arranged side by side in the left-right direction so that the rear end portions thereof extend along the partition wall (the partition wall 33 described later) on the front side of the housing 2. The load port 4 is configured to be able to replace the atmosphere inside the FOUP 100 with an inert gas such as nitrogen or the like. A door 4a is installed at the rear end of the load port 4. The door 4a is opened and closed by a door opening/closing mechanism (not shown). The door 4a is configured to be able to unlock the lid 101 of the FOUP 100 and hold the lid 101. The lid 101 is opened as the door movement mechanism opens the door 4a in a state in which the door 4a holds the unlocked lid 101. As a result, the wafer W in the FOUP 100 can be taken out by the transfer robot 3. The door 4a is configured so as not to move, for example, 100 mm or more toward the rear direction (inward of the housing 2) from the partition wall 33 even when the door 4a is opened by the door movement mechanism.

As shown in FIG. 2, the control device 5 is electrically connected to a robot controller 11 of the transfer robot 3, a controller (not shown) of the load port 4 and a controller (not shown) of the substrate processing apparatus 6 so as to make communication with these controllers. The control device 5 is electrically connected to an oxygen concentration meter 55, a first pressure gauge 56, a second pressure gauge 57 (details of which will be described later), a hygrometer 58 and the like, which are installed inside the housing 2. The control device 5 receives the measurement results of these measurement instruments to grasp the information regarding the atmosphere inside the housing 2. The control device 5 is electrically connected to a supply valve 61 and a discharge valve 62 (described later). The control device 5 adjusts the opening degrees of these valves to appropriately adjust the atmosphere inside the housing 2. Furthermore, the control device 5 is electrically connected to a fan driving motor 49 (details of which will be described later).

As shown in FIG. 1, the substrate processing apparatus 6 includes, for example, a load lock chamber 6a and a processing chamber 6b. The load lock chamber 6a is a chamber connected to the transfer chamber 41 across the door 2a of the housing 2 and configured to temporarily hold the wafer W. The processing chamber 6b is connected to the load lock chamber 6a via a door 6c. In the processing chamber 6b, a predetermined process is performed on the wafer W by a processing mechanism (not shown).

(Housing and Internal Configuration Thereof)

Figure 3:
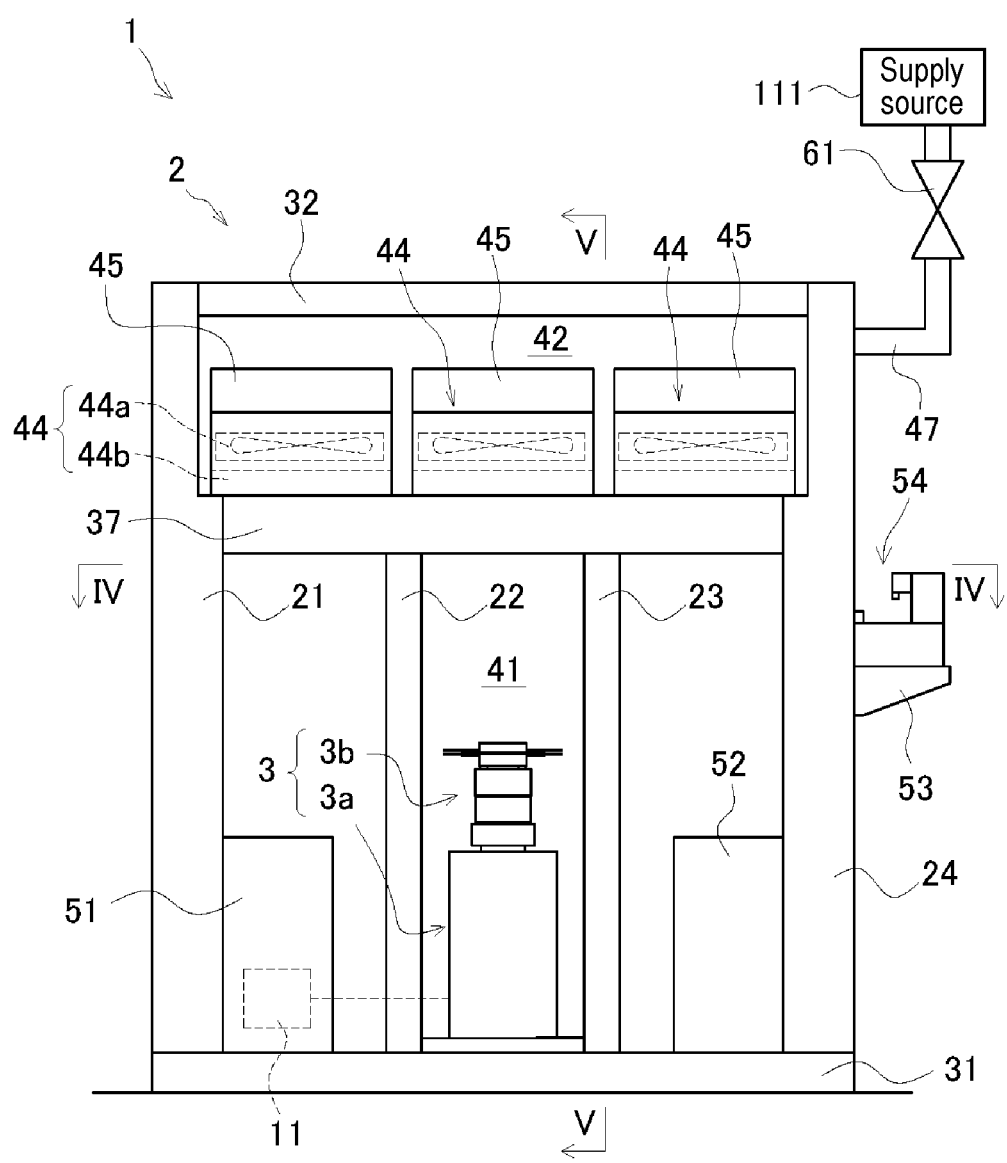
FIG. 3 is a front view of a housing.
Figure 4:
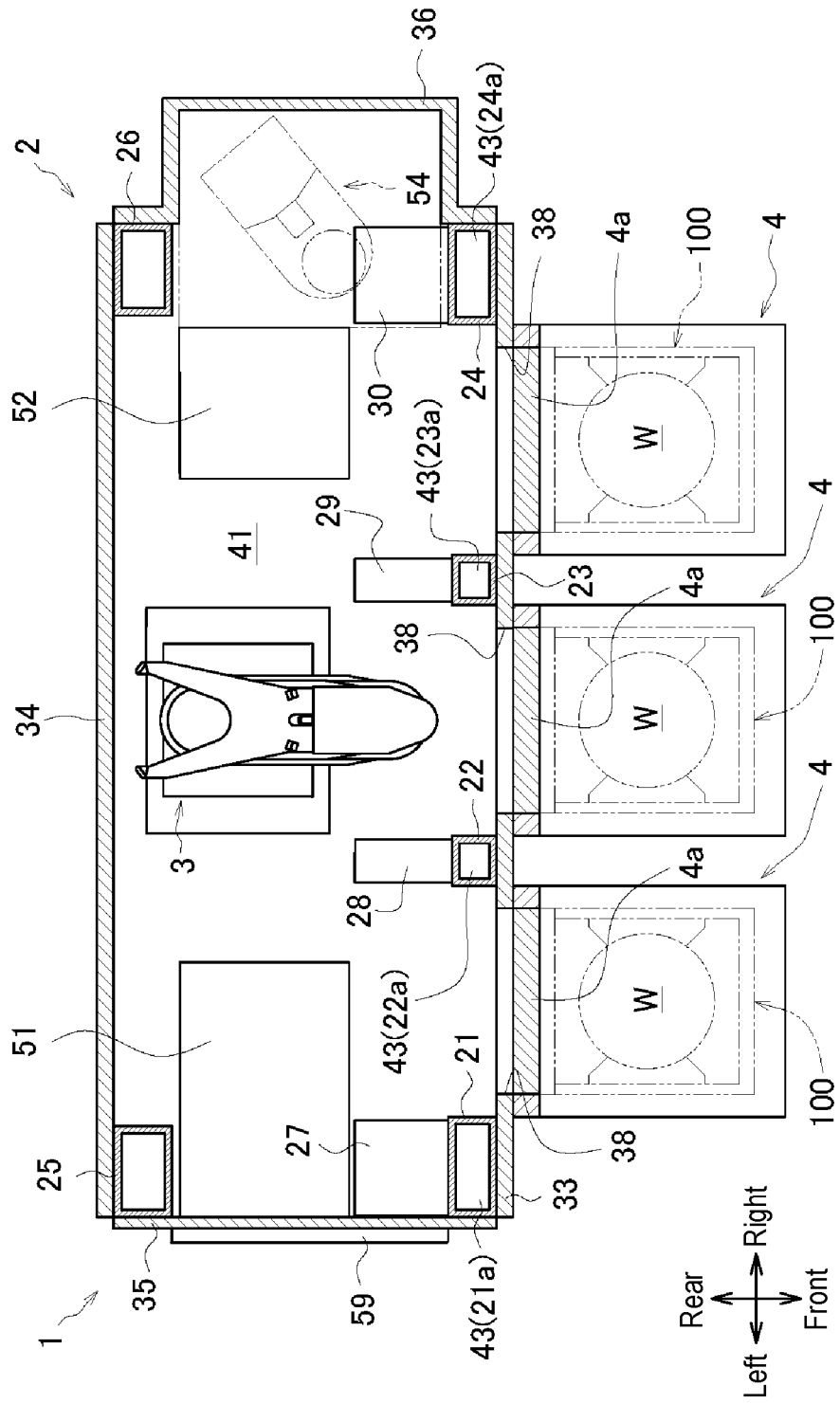
FIG. 4 is a sectional view taken along line IV-IV in FIG. 3.

Next, the housing 2 and the internal structure thereof will be described with reference to FIGS. 3 to 5. FIG. 3 is a front view of the housing 2. FIG. 4 is a sectional view taken along line IV-IV in FIG. 3. FIG. 5 is a sectional view taken along line V-V in FIG. 3. In FIG. 3, the illustration of the partition wall is omitted. In FIG. 5, the illustration of the transfer robot 3 and the like is omitted.

The housing 2 has a rectangular parallelepiped shape as a whole. As shown in FIGS. 3 to 5, the housing 2 includes columns 21 to 26 and partition walls 31 to 36. The partition walls 31 to 36 are attached to the columns 21 to 26 extending in the up-down direction. The internal space of the housing 2 is substantially sealed from the external space.

More specifically, as shown in FIG. 4, at the front end portion of the housing 2, the columns 21 to 24 are sequentially arranged upright from the left side to the right side. The columns 22 and 23 arranged between the columns 21 and 24 are shorter than the columns 21 and 24. The columns 25 and 26 are arranged upright on the left and right sides of the rear end portion of the housing 2.

The size of the columns 21 to 24 in the front-rear direction is, for example, 100 mm or less. That is, for example, a region up to 100 mm rearward in the front-rear direction from the inner surface of the partition wall 33 arranged at the front end of the housing 2 corresponds to the front end portion of the transfer chamber 41. However, the present disclosure is not limited thereto.

As shown in FIG. 3, the partition wall 31 is arranged at the bottom of the housing 2, and the partition wall 32 is arranged at the ceiling of the housing 2. As shown in FIG. 4, the partition wall 33 is arranged at the front end portion, the partition wall 34 is arranged at the rear end portion, the partition wall 35 is arranged at the left end portion, and the partition wall 36 is arranged at the right end portion. A plurality of openings 38 for loading and unloading the wafer W into and from the FOUP 100 mounted on the load port 4 is formed in the partition wall 33 at the front end portion side by side in the left-right direction. The substrate processing apparatus 6 (see FIG. 1) is connected to the partition wall 34 at the rear end portion. A mounting part 53 (see FIG. 3) on which an aligner 54 described later is mounted is installed at the right end portion of the housing 2. The aligner 54 and the mounting part 53 are also accommodated inside the housing 2 (see FIG. 4). In addition, a maintenance door 59 is installed at the left end portion of the housing 2 so that an operator can enter and leave the transfer chamber 41, for example, during maintenance (see FIG. 4).

As shown in FIGS. 3 and 5, a support plate 37 that extends in the horizontal direction is arranged in the upper portion inside the housing 2 (above the columns 22 and 23). By the support plate 37, the inside of the housing 2 is divided into the above-described transfer chamber 41 formed on the lower side and a unit installation chamber 42 formed on the upper side. An FFU (fan filter unit) 44 described later is arranged in the unit installation chamber 42. An opening 37a that brings the transfer chamber 41 and the unit installation chamber 42 into communication with each other is formed at the central portion of the support plate 37 in the front-rear direction. Each of the partition walls 33 to 36 of the housing 2 is divided into a lower wall for the transfer chamber 41 and an upper wall for the unit installation chamber 42 (see, e.g., the partition walls 33a and 33b at the front end portion and the partition walls 34a and 34b at the rear end portion in FIG. 5).

Next, the internal configuration of the housing 2 will be described. Specifically, the configuration for circulating nitrogen in the housing 2 and the surrounding configuration thereof, and the devices arranged in the transfer chamber 41 and the like will be described.

The configuration for circulating nitrogen in the housing 2 and the surrounding configuration thereof will be described with reference to FIGS. 3 to 5. As shown in FIG. 5, a circulation path 40 for circulating nitrogen is formed inside the housing 2. The circulation path 40 is defined by the transfer chamber 41, the unit installation chamber 42 and a return path 43. As an overview, in the circulation path 40, clean nitrogen is sent downward from the unit installation chamber 42. After reaching the lower end of the transfer chamber 41, nitrogen ascends through the return path 43 and returns to the unit installation chamber 42 (see arrows in FIG. 5).

An FFU 44 arranged on the support plate 37 and a chemical filter 45 arranged on the FFU 44 are installed in the unit installation chamber 42. The FFU 44 includes a fan 44a and a filter 44b. The FFU 44 sends nitrogen in the unit installation chamber 42 downward by the fan 44a, and removes particles (not shown) contained in the nitrogen by the filter 44b. The chemical filter 45 is designed to remove, for example, the active gas and the like brought into the circulation path 40 from the substrate processing apparatus 6. The nitrogen cleaned by the FFU 44 and the chemical filter 45 is sent from the unit installation chamber 42 to the transfer chamber 41 through the openings 37a formed in the support plate 37. The nitrogen sent to the transfer chamber 41 forms a laminar flow and flows downward.

The return path 43 is used to return the nitrogen flowing in the transfer chamber 41 to the unit installation chamber 42. The nitrogen returned to the unit installation chamber 42 is cleaned by the FFU 44 and the chemical filter 45, and is sent to the transfer chamber 41 again. In this way, nitrogen can be circulated in the circulation path 40. Details of the return path 43 will be described later.

As shown in FIG. 3, a supply pipe 47 for supplying nitrogen into the circulation path 40 is connected to the side portion of the unit installation chamber 42. The supply pipe 47 is connected to a nitrogen supply source 111. A supply valve 61 (a gas supplier in the present disclosure) capable of changing the supply amount of nitrogen per unit time is installed in the middle of the supply pipe 47. Furthermore, as shown in FIG. 5, a discharge pipe 48 for discharging the gas in the circulation path 40 is connected to the front end portion of the transfer chamber 41. The discharge pipe 48 is connected to, for example, an exhaust port (not shown). A discharge valve 62 (a discharger in the present disclosure) capable of changing the discharge amount of the gas in the circulation path 40 per unit time is installed in the middle of the discharge pipe 48. The supply valve 61 and the discharge valve 62 are electrically connected to the control device 5 (see FIG. 2). This makes it possible to appropriately supply and discharge nitrogen to and from the circulation path 40. For example, when the oxygen concentration in the circulation path 40 increases, the control device 5 controls the supply valve to temporarily supply a large amount of nitrogen from the supply source 111 to the circulation path 40 via the supply pipe 47, whereby the oxygen concentration can be reduced. Furthermore, for example, the control device 5 controls the discharge valve 62 based on the detection result of the first pressure gauge 56 (a first pressure detector in the present disclosure) (see FIG. 2), whereby the pressure in the transfer chamber 41 can be kept at a predetermined pressure. In the nitrogen circulation type EFEM 1, the pressure inside the circulation path 40 needs to be kept slightly higher than the external pressure in order to suppress the invasion of the ambient air into the circulation path 40 from the outside while suppressing the leakage of nitrogen from the circulation path 40 to the outside. Specifically, the pressure inside the circulation path 40 is in the range of 1 Pa(G) to 3000 Pa(G), preferably 3 Pa(G) to 500 Pa(G), and more preferably 5 Pa(G) to 100 Pa(G). Therefore, when the pressure measured by the first pressure gauge 56 installed in the transfer chamber 41 is out of the predetermined range, the control device 5 changes the opening degree of the discharge valve 62 to thereby change the nitrogen discharge flow rate. Therefore, the pressure is adjusted to fall within the predetermined range. That is, the supply amount of nitrogen is adjusted based on the oxygen concentration, and the discharge amount of the gas in the EFEM 1 is adjusted based on the detection result of the first pressure gauge 56, whereby the oxygen concentration and the pressure are controlled. In the present embodiment, the pressure is adjusted so that the pressure difference becomes 10 Pa (G). Alternatively, the control device 5 may control the opening degree of the discharge valve 62 according to the supply amount of nitrogen (the opening degree of the supply valve 61).

Next, the devices and the like arranged in the transfer chamber 41 will be described with reference to FIGS. 3 and 4. As shown in FIGS. 3 and 4, in the transfer chamber 41, there are arranged the above-described transfer robot 3, a controller storage box 51, a measurement instrument storage box 52, and an aligner 54. The controller storage box 51 is installed, for example, on the left side of the base part 3a of the transfer robot 3 (see FIG. 3) and is arranged so as not to interfere with the arm mechanism 3b (see FIG. 3). The robot controller 11 described above is stored in the controller storage box 51. The measurement instrument storage box 52 is installed, for example, on the right side of the base part 3a, and is arranged so as not to interfere with the arm mechanism 3b. The measurement instrument storage box 52 can accommodate the measurement instruments such as the oxygen concentration meter 55, the first pressure gauge 56, the hygrometer 58 and the like described above (see FIG. 2).

The aligner 54 detects how much the holding position of the wafer W held by the arm mechanism 3b of the transfer robot 3 (see FIG. 3) deviates from a target holding position. For example, the wafer W may be slightly moved inside the FOUP 100 (see FIG. 1) transferred by the OHT (not shown) described above. Therefore, the transfer robot 3 once mounts the unprocessed wafer W, which is taken out of the FOUP 100, on the aligner 54. The aligner 54 measures how far the wafer W is held by the transfer robot 3 from the target holding position, and sends the measurement result to the robot controller 11. The robot controller 11 corrects the holding position in the arm mechanism 3b based on the above measurement result, controls the arm mechanism 3b to hold the wafer W at the target holding position, and causes the arm mechanism 3b to transfer the wafer W to the load lock chamber 6a of the substrate processing apparatus 6. As a result, the wafer W can be normally processed by the substrate processing apparatus 6.

In the EFEM 1 having the above-described configuration, if the return path 43 is arranged at the left and right end portions or the rear end portion of the transfer chamber 41, the following problem may occur. In general, an incidental facility such as the aligner 54 or the like described above, a maintenance door 59 and the like are often arranged at the left and right end portions of the transfer chamber 41. Examples of other incidental facilities include a buffer station (not shown) for temporarily placing the wafer W, a cooling table (not shown) for cooling the wafer W processed by the substrate processing apparatus 6, and the like. As in the present embodiment, the incidental facility may be arranged at one of the left and right end portions, and the maintenance door 59 may be arranged at the other one of the left and right end portions. Alternatively, incidental facilities may be arranged on the left and right sides, or maintenance doors 59 may be arranged on the left and right sides. For this reason, if the return path 43 is disposed on the side surface (that is, if one side surface is occupied by the return path 43), there is a possibility that restrictions may be imposed on the installation of the incidental facility, the maintenance door and the like. Furthermore, when the return path 43 is arranged at the rear end portion connected to the substrate processing apparatus 6, it may be necessary to change the arrangement position of the return path 43 according to the specifications of the substrate processing apparatus 6 or the like. Therefore, there is a problem that mass production becomes difficult. Accordingly, in the EFEM 1 of the present embodiment, the return path 43 is configured as follows in order to solve the above problem.

(Detailed Configuration of Return Path)

The detailed configuration of the return path 43 will be described with reference to FIGS. 4 and 5. As shown in FIG. 4, the return path 43 is installed inside the columns 21 to 24 (columnar members in the present disclosure) that are arranged at the front end portion of the transfer chamber 41 to form the transfer chamber 41. That is, the columns 21 to 24 are hollow, and the spaces 21a to 24a through which nitrogen flows are formed inside the columns 21 to 24 (see FIG. 4). That is, the spaces 21a to 24a constitute the return path 43. The return path 43 is brought into communication with the unit installation chamber 42 by an opening 37b formed at the front end portion of the support plate 37 (see FIG. 5). The plurality of openings 38 (openings in the present disclosure) described above is arranged between the columns 21 to 24 in the left-right direction (see FIG. 4). That is, the columns 21 to 24 and the plurality of openings 38 are arranged so as not to overlap with each other in the left-right direction. Furthermore, introduction ducts 27 to 30 for guiding the nitrogen in the transfer chamber 41 to the return path 43 (the spaces 21a to 24a) are attached to the lower portions of the columns 21 to 24, respectively. The introduction ducts 27 to 30 are arranged below the movable range of the arm mechanism 3b (see FIG. 3) of the transfer robot 3 (below the transfer area in which the wafer W is transferred) so as not to interfere with the arm mechanism 3b. Therefore, the introduction ducts 27 to 30 can be caused to protrude rearward of the columns 21 to 24. In order to secure a necessary flow path area in the return path 43, the columns 21 and 24 are thicker in the left-right direction than the columns 22 and 23, and the cross-sectional areas of the spaces 21a and 24a are larger than those of the spaces 22a and 23a (see FIG. 4).

Thus, the left and right end portions (side surfaces) of the transfer chamber 41 are not occupied by the return path 43. Therefore, as compared with the configuration in which the side surfaces of the transfer chamber 41 are occupied by the return path, it is possible to suppress restrictions on the installation of the incidental facility such as the aligner 54 or the like, the maintenance door (not shown) and the like on the side surfaces of the transfer chamber 41. For example, the maintenance door may be installed on the partition wall 35 at the left end portion (see FIG. 4). Moreover, the maintenance of the aligner 54 may be easily performed by forming an opening (not shown) in the partition wall 36 at the right end portion (see FIG. 4) and installing a door (not shown). Alternatively, the partition walls 35 and 36 may be removably installed to the housing 2. In this case, the incidental facility can be easily accessed by removing the partition walls at the time of maintenance. Furthermore, the return path 43 is not arranged at the rear end portion of the transfer chamber 41. Therefore, it is not necessary to change the arrangement position of the return path 43 according to the specifications of the substrate processing apparatus 6 or the like.

The return path 43 will be described in more detail with reference to FIG. 5. Although the column 23 and the introduction duct 29 are shown in FIG. 5, the same applies to other columns 21, 22 and 24 and the introduction ducts 27, 28 and 30. An opening 23b is formed in the lower portion of the rear end portion of the column 23. Furthermore, an opening 29a is formed in the introduction duct 29 attached to the lower portion of the column 23. Thus, the space 23a inside the column 23 communicates with the introduction duct 29, whereby the nitrogen that has reached the lower end portion of the transfer chamber 41 can flow into the return path 43 via the introduction duct 29. The opening 29a is configured to face downward. Therefore, the gas reaching the partition wall 31 from above can be smoothly sucked inward without disturbing the flow of the gas flowing from above. Furthermore, the gas sucked through the opening 29a can be allowed to flow upward without changing the gas flow direction. On the upper portion of the introduction duct 27, there is formed an enlarged portion 29b which extends backward as it goes downward. A fan 46 (a fan in the present disclosure) is installed below the enlarged portion 29b. The fan 46 is rotationally driven by a fan driving motor 49 (a driver in the present disclosure). The fan 46 sucks the nitrogen that has reached the lower end portion of the transfer chamber 41 and sends the nitrogen to the return path 43 (the space 23a in FIG. 5), thereby returning the nitrogen toward the unit installation chamber 42.

(Internal Configuration of Unit Installation Chamber and Pressure Control)

Next, the internal configuration of the unit installation chamber 42 and the pressure control will be described. The oxygen concentration in the transfer chamber 41 is detected by the oxygen concentration meter 55 (see FIG. 2), and the pressure in the transfer chamber 41 is detected by the first pressure gauge 56 (see FIG. 2). The control device 5 controls the opening degrees of the supply valve 61 and the discharge valve 62. However, it has been found by the present inventor that the oxygen concentration is unlikely to become a desired value or less (e.g., 100 ppm or less) only by the above control. As a result of a study conducted by the present inventor, it has been found that the pressure in the unit installation chamber 42 tends to be lower than the external pressure and the ambient air is likely to enter the unit installation chamber 42 from the outside. Presumably, the reason is that the flow path resistance of the return path 43 is higher than the flow path resistance of the opening 37a (see FIG. 5) and the flow rate of the nitrogen returning to the unit installation chamber 42 through the return path 43 tends to be smaller than the flow rate of the nitrogen sent from the unit installation chamber 42 to the transfer chamber 41 by the FFU 44. Therefore, in the present embodiment, the nitrogen in the return path 43 is actively returned toward the unit installation chamber 42 by the fan 46.

However, if the rotation speed of the fan 46 is high and the flow rate of the nitrogen returning to the unit installation chamber 42 is too high, the pressure in the unit installation chamber 42 may be increased, and the gas flow of the nitrogen sent to the transfer chamber 41 by the FFU 44 may be unstable. Therefore, in the present embodiment, as shown in FIG. 5, the second pressure gauge 57 (a second pressure detector in the present disclosure) is arranged in the unit installation chamber 42. The second pressure gauge 57 is configured to detect the pressure in the unit installation chamber 42 and send the detection result to the control device 5.

Figure 6A:
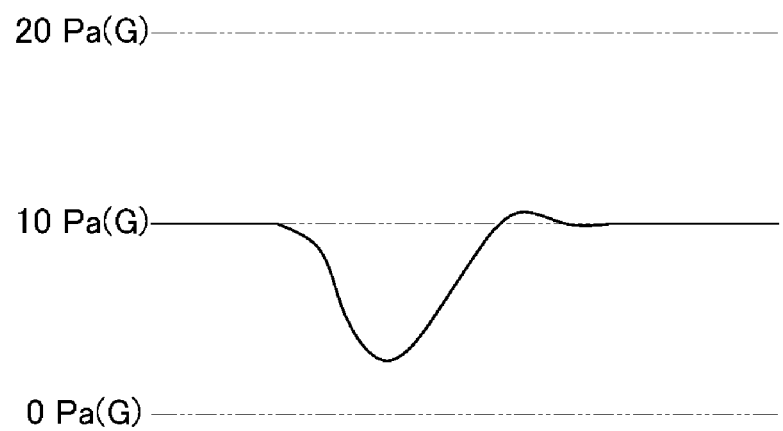
FIGS. 6A and 6B are diagrams showing feed-back control of a pressure in a unit installation chamber.
Figure 6B:
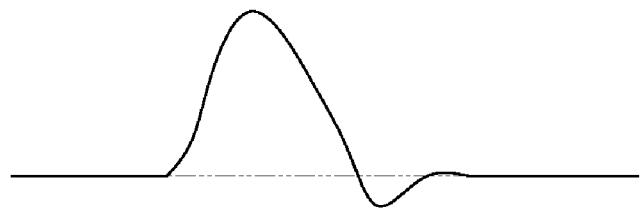

The pressure control of the unit installation chamber 42 by the control device 5 will be described with reference to FIGS. 6A and 6B. FIG. 6A is a diagram showing a time-dependent change of the pressure in the unit installation chamber 42. FIG. 6B is a diagram showing a time-dependent change of the rotation speed of the fan 46. The control device 5 controls the fan driving motor 49 (see FIGS. 2 and 5) based on the detection result of the second pressure gauge 57 (see FIG. 2) so that the pressure in the unit installation chamber 42 is maintained at a target pressure, and feed-back controls the rotation speed of the fan 46 (see FIG. 5). The target pressure is, for example, a pressure (10 Pa(G)) higher than the pressure (atmospheric pressure) outside the housing 2 by 10 Pa. That is, it is preferable to keep the pressure inside the unit installation chamber 42 slightly higher than the external pressure. The differential pressure in the unit installation chamber 42 is in the range of 1 to 3000 Pa(G), preferably 3 to 500 Pa(G), and more preferably 5 to 100 Pa(G).

For example, when the pressure inside the unit installation chamber 42 becomes lower than 10 Pa(G) as shown in FIG. 6A, the control device 5 increases the rotation speed of the fan 46 as shown in FIG. 6B to increase the flow rate of the nitrogen sent from the return path 43 to the unit installation chamber 42, thereby bringing the pressure in the unit instal-lation chamber 42 close to 10 Pa(G). On the contrary, when the pressure in the circulation path 40 becomes higher than 10 Pa(G), the control device 5 slows down the rotation speed of the fan 46 to reduce the flow rate of the inert gas returned from the return path 43 to the unit installation chamber 42. A specific control method may preferably be, but is not limited to, generally-known PID control (control for performing proportional control, integral control and derivative control).

As described above, the return path 43 is arranged at the front end portion of the transfer chamber 41. Thus, it is possible to adopt a configuration in which neither of the end portions (side surfaces) in the left-right direction is occupied by the return path 43. Therefore, it is possible to suppress imposition of restrictions on the installation of the incidental facility, the maintenance door and the like. Furthermore, by adopting a configuration in which the return path 43 is not arranged at the rear end portion, it is possible to eliminate the need to change the arrangement position of the return path 43 or the like according to the specifications of the substrate processing apparatus 6. Accordingly, in the inert gas circulation type EFEM 1, it is possible to suppress imposition of restrictions on the installation of the incidental facility, the maintenance door and the like, and to make it unnecessary to change the arrangement position of the return path 43 or the like according to the specifications of the substrate processing apparatus 6 connected to the EFEM 1.

Furthermore, the return path 43 is built in the hollow columns 21 to 24. Therefore, it is possible to suppress an increase in the installation area of the EFEM 1 as compared with a configuration in which the return path 43 is installed separately from the columns 21 to 24.

Furthermore, the fan 46 is installed inside the introduction ducts 27 to 30. Therefore, the installation of the fan 46 can be facilitated by making the size of the introduction ducts 27 to 30 appropriate.

Moreover, the opening 29a is configured to face downward. Therefore, the gas reaching the partition wall 31 from above can be smoothly sucked inward without disturbing the flow of the gas flowing from above. Furthermore, the gas sucked through the opening 29a can be allowed to flow upward without changing the gas flow direction.

Furthermore, the plurality of columns 21 to 24 is arranged at the positions where they do not overlap with the plurality of openings 38 (that is, so as not to interfere with the wafer W taken into and out of the FOUP 100), and the return path 43 is formed inside the columns 21 to 24. As described above, the plurality of return paths 43 is installed by efficiently utilizing the space in which the columns 21 to 24 can be arranged. Therefore, it is possible to easily secure the required flow path area while suppressing the increase in the size of the columns 21 to 24.

Furthermore, by supplying the inert gas to the circulation path 40, it is possible to rapidly reduce the concentration of the gas (impurity) other than the inert gas. Moreover, by discharging the gas in accordance with the supply amount of the inert gas or the pressure change in the transfer chamber 41, it is possible to appropriately control the pressure in the transfer chamber 41.

Furthermore, the control device 5 controls the fan driving motor 49 (i.e., controls the rotation speed of the fan 46), whereby the pressure in the unit installation chamber 42 is kept at an appropriate target pressure. Accordingly, it is possible to suppress the decrease in the pressure in the unit installation chamber 42 and the entry of the external gas into the unit installation chamber 42, or to suppress the increase in the pressure in the unit installation chamber 42 and the destabilization of the gas flow of the nitrogen sent to the transfer chamber 41 by the FFU 44.

Next, modifications of the above-described embodiment will be described. The components having the same configurations as those of the above-described embodiment are designated by like reference numerals, and the description thereof will be appropriately omitted.

(1) In the above-described embodiment, the spaces 21*a* to 24*a* inside the columns 21 to 24 are the return path 43. However, the present disclosure is not limited thereto. For example, tubes (not shown) or pipes (not shown) may be accommodated in the spaces 21*a* to 24*a*, and may be used as the return path.

(2) Although the return path 43 is installed inside the columns 21 to 24 in the above-described embodiment, the present disclosure is not limited thereto. For example, a duct (not shown) or the like may be arranged adjacent to the columns 21 to 24, and the duct may serve as the return path.

(3) In the above-described embodiment, the fan 46 is installed in the introduction ducts 27 to 30. However, the present disclosure is not limited thereto. That is, the fan 46 does not necessarily have to be installed. Even with such a configuration, the FFU 44 disposed in the unit installation chamber 42 can suck nitrogen from the return path 43 side and send it toward the transfer chamber 41, whereby the nitrogen can be circulated in the circulation path 40.

(4) In the above-described embodiment, nitrogen is used as the inert gas. However, the present disclosure is not limited thereto. For example, argon or the like may be used as the inert gas.

EXPLANATION OF REFERENCE NUMERALS

1: EFEM, 4: load port, 5: control device (controller), 6: substrate processing apparatus, 21 to 24: column (columnar member), 27 to 30: introduction duct, 38: opening, 41: transfer chamber, 42: unit installation chamber, 43: return path, 46: fan, 49: fan driving motor (driver), 56: first pressure gauge (first pressure detector), 57: second pressure gauge (second pressure detector), 61: supply valve (gas supplier), 62: discharge valve (discharger)

What is claimed is:

1. An EFEM comprising:
a transfer chamber in which a substrate is transferred;
a unit installation chamber in which a fan filter unit configured to send an inert gas to the transfer chamber is installed;
a columnar member configured to form an inner portion of the transfer chamber and whose inside is formed to be hollow; and
a return path installed inside the columnar member and configured to return the inert gas flowing in the transfer chamber to the unit installation chamber,
wherein a substrate processing apparatus configured to perform a predetermined process on the substrate is connected to one end portion of the transfer chamber at one side of a predetermined depth direction, and
the columnar member, in which the return path is installed, is arranged in an other end portion of the transfer chamber at an other side of the depth direction.

2. The EFEM of claim 1, further comprising:
an introduction duct installed in the columnar member so as to communicate with the return path and configured to guide the inert gas in the transfer chamber to the return path; and
a fan installed in the introduction duct and configured to send the inert gas in the return path toward the unit installation chamber.

3. The EFEM of claim 2, wherein a circulation path includes the transfer chamber, the unit installation chamber and the return path, and is configured so that the inert gas in the transfer chamber flows downward,
an opening portion through which the inert gas flows is formed in the introduction duct, and
the opening portion is configured to face downward.

4. The EFEM of claim 3, further comprising:
a plurality of columnar members, as the columnar member, arranged side by side in a width direction orthogonal to the depth direction; and
a plurality of load ports arranged outside the transfer chamber at the other side of the depth direction, arranged side by side in the width direction, and each configured to mount a container accommodating the substrate,
wherein a plurality of openings for loading and unloading the substrate into and from the container mounted on each of the load ports is formed in the other end portion of the transfer chamber at the other side of the depth direction,
the plurality of openings is respectively arranged between the plurality of columnar members in the width direction, and
the return path is installed inside each of the plurality of columnar members.

5. The EFEM of claim 4, further comprising:
a gas supplier configured to supply the inert gas to at least one of the transfer chamber, the unit installation chamber and the return path;
a discharger configured to discharge a gas containing the inert gas from at least one of the transfer chamber, the unit installation chamber and the return path;
a first pressure detector installed in the transfer chamber; and
a controller,
wherein the controller is configured to adjust a gas discharge amount discharged from the discharger according to a supply amount of the inert gas or a detection result of the first pressure detector of the transfer chamber.

6. The EFEM of claim 5, further comprising:
a driver configured to rotationally drive the fan; and
a second pressure detector arranged in the unit installation chamber,
wherein the controller is configured to control the driver based on a detection result of the second pressure detector so that a pressure in the unit installation chamber is maintained at a target pressure.

7. An EFEM comprising:
a transfer chamber in which a substrate is transferred;
a unit installation chamber in which a fan filter unit configured to send an inert gas to the transfer chamber is installed;
a plurality of columnar members configured to form the transfer chamber, wherein an inside of each of the plurality of columnar members is formed to be hollow;
a return path installed inside each of the plurality of columnar members and configured to return the inert gas flowing in the transfer chamber to the unit installation chamber, and
a plurality of load ports, each of which configured to mount a container accommodating the substrate, wherein a substrate processing apparatus configured to perform a predetermined process on the substrate is connected to one end portion of the transfer chamber at one side of a redetermined depth direction, the plurality of columnar members is arranged side by side in a width direction orthogonal to the depth direction, the plurality of columnar members and the return path are arranged in an other end portion of the transfer chamber at an other side of the depth direction, the plurality of load ports is arranged outside the transfer chamber at the other side of the depth direction, and is arranged side by side in the width direction, a plurality of openings for loading and unloading the substrate into and from the container mounted on each of the load ports is formed in the other end portion of the transfer chamber at the other side of the depth direction, and the plurality of openings is respectively arranged between the plurality of columnar members in the width direction.

8. The EFEM of claim 1, further comprising:

a gas supplier configured to supply the inert gas to at least one of the transfer chamber, the unit installation chamber and the return path;

a discharger configured to discharge a gas containing the inert gas from at least one of the transfer chamber, the unit installation chamber and the return path;

a first pressure detector installed in the transfer chamber; and a controller, wherein the controller is configured to adjust a gas discharge amount discharged from the discharger according to a supply amount of the inert gas or a detection result of the first pressure detector of the transfer chamber.

9. The EFEM of claim 1, further comprising:

a fan configured to send the inert gas in the return path toward the unit installation chamber;

a driver configured to rotationally drive the fan;

a second pressure detector arranged in the unit installation chamber; and a controller, wherein the controller is configured to control the driver based on a detection result of the second pressure detector so that a pressure in the unit installation chamber is maintained at a target pressure.

10. The EFEM of claim 7, further comprising:

an introduction duct installed in the columnar member so as to communicate with the return path and configured to guide the inert gas in the transfer chamber to the return path; and a fan installed in the introduction duct and configured to send the inert gas in the return path toward the unit installation chamber.

11. The EFEM of claim 10, wherein a circulation path includes the transfer chamber, the unit installation chamber and the return path, and is configured so that the inert gas in the transfer chamber flows downward, an opening portion through which the inert gas flows is formed in the introduction duct, and the opening portion is configured to face downward.

12. The EFEM of claim 11, further comprising:

a gas supplier configured to supply the inert gas to at least one of the transfer chamber, the unit installation chamber and the return path;

a discharger configured to discharge a gas containing the inert gas from at least one of the transfer chamber, the unit installation chamber and the return path;

a first pressure detector installed in the transfer chamber; and a controller, wherein the controller is configured to adjust a gas discharge amount discharged from the discharger according to a supply amount of the inert gas or a detection result of the first pressure detector of the transfer chamber.

13. The EFEM of claim 12, further comprising:

a driver configured to rotationally drive the fan; and a second pressure detector arranged in the unit installation chamber, wherein the controller is configured to control the driver based on a detection result of the second pressure detector so that a pressure in the unit installation chamber is maintained at a target pressure.

* * * * *